(12) United States Patent
Brabec et al.

(10) Patent No.: US 9,184,317 B2
(45) Date of Patent: Nov. 10, 2015

(54) ELECTRODE CONTAINING A POLYMER AND AN ADDITIVE

(75) Inventors: Christoph Brabec, Linz (AT); Jens Hauch, Heroldsberg (DE); Russell Gaudiana, Merrimack, NH (US); Andrea Welte, Nuremberg (DE); Jin-An He, Parsippany, NJ (US); Eitan C. Zeira, Hollis, NH (US)

(73) Assignee: MERCK PATENT GMBH, Darmstadt (DE)

( * ) Notice: Subject to any disclaimer, the term of this patent is extended or adjusted under 35 U.S.C. 154(b) by 359 days.

(21) Appl. No.: 12/061,267

(22) Filed: Apr. 2, 2008

(65) Prior Publication Data
US 2008/0236657 A1  Oct. 2, 2008

Related U.S. Application Data

(60) Provisional application No. 60/909,539, filed on Apr. 2, 2007, provisional application No. 60/921,407, filed on Apr. 2, 2007.

(51) Int. Cl.
*H01L 31/0224* (2006.01)
*B82Y 10/00* (2011.01)
*H01L 51/44* (2006.01)
*H01L 51/00* (2006.01)

(52) U.S. Cl.
CPC ......... *H01L 31/022425* (2013.01); *B82Y 10/00* (2013.01); *H01L 31/022466* (2013.01); *H01L 51/441* (2013.01); *C08G 2261/91* (2013.01); *H01L 51/0003* (2013.01); *H01L 51/0022* (2013.01); *H01L 51/0036* (2013.01); *H01L 51/0037* (2013.01); *H01L 51/0043* (2013.01); *H01L 51/0047* (2013.01); *Y02E 10/549* (2013.01)

(58) Field of Classification Search
CPC ................ H01L 31/00; H01L 31/0216; H01L 31/02167; H01L 31/0224; H01L 31/022425; H01L 31/02; H01L 31/02002; H01L 31/02008; H01L 31/04; H01L 31/048; H01L 31/0481
USPC ................ 136/243–265; 438/57–98
See application file for complete search history.

(56) References Cited

U.S. PATENT DOCUMENTS

| | | |
|---|---|---|
| 2,780,765 A | 2/1957 | Chapin et al. |
| 3,253,173 A | 5/1966 | Levetan |
| 3,442,007 A | 5/1969 | Humrick et al. |
| 3,597,072 A | 8/1971 | Brown et al. |
| 3,778,684 A | 12/1973 | Fischer et al. |

(Continued)

FOREIGN PATENT DOCUMENTS

| | | |
|---|---|---|
| DE | 198 22 024 A1 | 11/1999 |
| DE | 10 2004 049160 | 5/2005 |

(Continued)

OTHER PUBLICATIONS

Definition of "inherent" from Merriam-Webster online retrieved on Apr. 8, 2014.*

(Continued)

*Primary Examiner* — Christina Chern
(74) *Attorney, Agent, or Firm* — Bowditch & Dewey, LLP; Roger P. Zimmerman (57) ABSTRACT

Photovoltaic cells, as well as related systems, methods, modules, and components, are disclosed.

12 Claims, 4 Drawing Sheets

(56) References Cited

U.S. PATENT DOCUMENTS

| | | |
|---|---|---|
| 3,786,307 A | 1/1974 | Robinson |
| 3,935,493 A | 1/1976 | Brouwer |
| 4,025,814 A | 5/1977 | Schampers et al. |
| 4,105,470 A | 8/1978 | Skotheim |
| 4,166,919 A | 9/1979 | Carlson |
| 4,212,932 A | 7/1980 | Calgari et al. |
| 4,231,808 A | 11/1980 | Tabei et al. |
| 4,239,555 A | 12/1980 | Scharlack et al. |
| 4,380,112 A | 4/1983 | Little |
| 4,385,102 A | 5/1983 | Fitzky et al. |
| 4,419,424 A | 12/1983 | Julian |
| 4,501,808 A * | 2/1985 | Sakai et al. ............... 430/58.4 |
| 4,518,894 A | 5/1985 | Andreadakis |
| 4,556,817 A | 12/1985 | Kusano et al. |
| 4,563,617 A | 1/1986 | Davidson |
| 4,564,784 A | 1/1986 | Ishioka et al. |
| 4,589,194 A | 5/1986 | Roy |
| 4,900,975 A | 2/1990 | Shimomoto et al. |
| 5,131,065 A | 7/1992 | Briggs et al. |
| 5,158,618 A | 10/1992 | Rubin et al. |
| 5,240,510 A | 8/1993 | Goldade et al. |
| 5,287,169 A | 2/1994 | Pollak et al. |
| 5,293,564 A | 3/1994 | Sukegawa et al. |
| 5,331,183 A | 7/1994 | Sariciftci et al. |
| 5,380,371 A | 1/1995 | Murakami |
| 5,454,880 A | 10/1995 | Sariciftci et al. |
| 5,455,899 A | 10/1995 | Forslund |
| 5,474,620 A | 12/1995 | Nath et al. |
| 5,482,570 A | 1/1996 | Saurer et al. |
| 5,488,386 A | 1/1996 | Yamagishi et al. |
| 5,617,203 A | 4/1997 | Kobayashi et al. |
| 5,681,402 A | 10/1997 | Ichinose et al. |
| 5,684,325 A | 11/1997 | Kataoka et al. |
| 5,688,366 A | 11/1997 | Ichinose |
| 5,814,420 A | 9/1998 | Chu |
| 6,040,520 A | 3/2000 | Morooka et al. |
| 6,077,712 A | 6/2000 | Livingston |
| 6,078,643 A | 6/2000 | Vogelsong et al. |
| 6,281,430 B1 | 8/2001 | Lupo |
| 6,291,763 B1 | 9/2001 | Nakamura |
| 6,340,789 B1 | 1/2002 | Petritsch et al. |
| 6,342,875 B2 | 1/2002 | Todokoro |
| 6,355,873 B1 | 3/2002 | Ishikawa |
| 6,358,765 B2 | 3/2002 | Tanaka |
| 6,359,211 B1 | 3/2002 | Spitler et al. |
| 6,376,765 B1 | 4/2002 | Wariishi et al. |
| 6,407,330 B1 | 6/2002 | Lindsey et al. |
| 6,420,648 B1 | 7/2002 | Lindsey |
| 6,429,369 B1 | 8/2002 | Tober et al. |
| 6,444,400 B1 | 9/2002 | Cloots et al. |
| 6,472,594 B1 | 10/2002 | Ichinose et al. |
| 6,538,194 B1 | 3/2003 | Koyanagi et al. |
| 6,559,375 B1 | 5/2003 | Meissner et al. |
| 6,580,026 B1 | 6/2003 | Koyanagi et al. |
| 6,683,244 B2 | 1/2004 | Fujimori et al. |
| 6,706,963 B2 | 3/2004 | Gaudiana et al. |
| 6,852,920 B2 | 2/2005 | Sager et al. |
| 6,867,539 B1 | 3/2005 | McCormick et al. |
| 6,878,871 B2 | 4/2005 | Scher et al. |
| 6,913,713 B2 | 7/2005 | Chittibabu et al. |
| 6,936,761 B2 | 8/2005 | Pichler |
| 6,946,597 B2 | 9/2005 | Sager et al. |
| 7,022,910 B2 | 4/2006 | Gaudiana et al. |
| 2001/0035924 A1 | 11/2001 | Fujieda |
| 2001/0043170 A1 | 11/2001 | Todokoro |
| 2001/0049153 A1 | 12/2001 | Tanaka |
| 2001/0054872 A1 | 12/2001 | Okigawa et al. |
| 2002/0012565 A1 | 1/2002 | Sirna et al. |
| 2002/0167619 A1 | 11/2002 | Bietsch et al. |
| 2002/0182310 A1 | 12/2002 | Wang |
| 2002/0189663 A1 | 12/2002 | Nagasawa |
| 2003/0019518 A1 | 1/2003 | Shimizu et al. |
| 2003/0056821 A1 | 3/2003 | Chittibabu et al. |
| 2003/0108664 A1 | 6/2003 | Kodas et al. |
| 2003/0230337 A1 * | 12/2003 | Gaudiana et al. ............. 136/256 |
| 2004/0084080 A1 | 5/2004 | Sager et al. |
| 2004/0099305 A1 | 5/2004 | Heller |
| 2004/0112420 A1 | 6/2004 | Spivack et al. |
| 2004/0112421 A1 | 6/2004 | Spivack et al. |
| 2004/0115858 A1 | 6/2004 | Spivack et al. |
| 2004/0118444 A1 | 6/2004 | Duggal et al. |
| 2004/0118448 A1 | 6/2004 | Scher et al. |
| 2004/0121508 A1 * | 6/2004 | Foust et al. ................ 438/99 |
| 2004/0187911 A1 | 9/2004 | Gaudiana et al. |
| 2004/0187917 A1 | 9/2004 | Pichler |
| 2004/0201878 A1 | 10/2004 | Agrawal et al. |
| 2004/0250848 A1 | 12/2004 | Sagar et al. |
| 2004/0254297 A1 | 12/2004 | Hsu et al. |
| 2005/0016578 A1 | 1/2005 | Enomoto et al. |
| 2005/0022865 A1 | 2/2005 | Robeson et al. |
| 2005/0067007 A1 | 3/2005 | Toft |
| 2005/0098204 A1 | 5/2005 | Roscheisen et al. |
| 2005/0098205 A1 | 5/2005 | Roscheisen et al. |
| 2005/0126629 A1 | 6/2005 | Okada et al. |
| 2005/0133084 A1 | 6/2005 | Joge et al. |
| 2005/0184306 A1 | 8/2005 | Parker et al. |
| 2005/0189014 A1 | 9/2005 | Gaudiana et al. |
| 2005/0194038 A1 * | 9/2005 | Brabec et al. ................ 136/256 |
| 2005/0257827 A1 * | 11/2005 | Gaudiana et al. ............. 136/263 |
| 2005/0279399 A1 | 12/2005 | Gaudiana et al. |
| 2006/0090791 A1 | 5/2006 | Gaudiana et al. |
| 2006/0180193 A1 * | 8/2006 | Park et al. ................ 136/243 |
| 2007/0131277 A1 | 6/2007 | Gaudiana et al. |
| 2009/0211633 A1 * | 8/2009 | Schilinsky et al. ............. 136/256 |

FOREIGN PATENT DOCUMENTS

| | | |
|---|---|---|
| EP | 0 911 841 B1 | 10/1998 |
| EP | 0 924 724 A2 | 12/1998 |
| EP | 0 969 517 A1 | 1/2000 |
| EP | 1 052 661 A2 | 11/2000 |
| EP | 1 087 412 A1 | 3/2001 |
| EP | 1 091 373 A1 | 4/2001 |
| EP | 1 096 522 | 5/2001 |
| EP | 1 107 332 A2 | 6/2001 |
| EP | 1 174 891 A2 | 1/2002 |
| EP | 1 450 420 A1 | 8/2004 |
| JP | 59-096639 | 4/1984 |
| JP | 61-140037 | 6/1986 |
| JP | 63-289874 | 11/1988 |
| JP | 05-063218 | 8/1993 |
| JP | 06-079779 | 3/1994 |
| JP | 06-204529 | 7/1994 |
| JP | 07-130408 | 5/1995 |
| JP | 08-073834 | 3/1996 |
| JP | 08-075543 | 3/1996 |
| JP | 08-036977 | 6/1996 |
| JP | 08-287969 | 11/1996 |
| JP | 11-273753 | 10/1999 |
| JP | 2000-243990 | 9/2000 |
| JP | 2000-294306 | 10/2000 |
| JP | 2001-031962 | 2/2001 |
| JP | 2001-110462 | 4/2001 |
| JP | WO 01/39276 | 5/2001 |
| JP | 2001-243995 | 9/2001 |
| JP | 2002-050413 | 2/2002 |
| JP | 2002-184475 | 6/2002 |
| JP | 2002-184477 | 6/2002 |
| JP | 2002-298936 | 10/2002 |
| JP | 2002-314108 | 10/2002 |
| JP | 2003-123855 | 4/2003 |
| JP | 2003-174178 | 6/2003 |
| JP | 2004-158661 | 6/2004 |
| JP | 2004-296669 | 10/2004 |
| JP | 2005-353904 | 12/2005 |
| JP | 2006-324111 | 11/2006 |
| WO | WO 93/20569 A1 | 10/1993 |
| WO | WO 98/36433 | 8/1998 |
| WO | WO 98/36434 | 8/1998 |
| WO | WO 99/59024 | 11/1999 |
| WO | WO 99/66519 | 12/1999 |
| WO | WO 99/66520 | 12/1999 |
| WO | WO 00/11725 | 3/2000 |
| WO | WO 00/38001 | 6/2000 |

(56) References Cited

FOREIGN PATENT DOCUMENTS

| WO | WO 00/48212 | 8/2000 | | |
|---|---|---|---|---|
| WO | WO 00/57441 | 9/2000 | | |
| WO | WO 00/65617 | 11/2000 | | |
| WO | WO 01/25316 | 4/2001 | | |
| WO | WO 03/041177 | 5/2003 | | |
| WO | WO 03/102986 | 12/2003 | | |
| WO | WO 03/107451 | * 12/2003 | ............. | H01L 51/20 |
| WO | WO 2004/019666 | 3/2004 | | |
| WO | WO 2004/095599 | 11/2004 | | |

OTHER PUBLICATIONS

Chirvase et al., "Temperature dependent characteristics o poly(3-hexyltheiophene)-fullerene based heterojunctio norganic solar cells," J. of Applied Physics, 93(6):3376-3383, 2003.

Greczynski et al., "Characterization of the PEDOT-PSS system by means of X-ray and Ultraviolet Photoelectron Spectroscopy," Thin Solid Films, 1999, pp. 129-135.

Hiramoto et al., "Effect of Thin Gold Interstitial-layer on the Photovoltaic Properties of Tandem Organic Solar Cell," Chemistry Letters, The chemistry Society of Japan, pp. 327-330, 1990.

Shaheen et al., "2.5% Efficient Organic Plastic Solar Cells." Applied Physics Letters, 78:6, pp. 841-843, Feb. 5, 2001.

Yao et al., "Large photo-induced voltage in a ferroelectric thin film with in-plane polarization," Appl. Phys. Letters, 87:2129061-2129063, (2005).

Jao van de Lagemaat, Teresa M. Barnes, Garry Rumbles, Sean E. Shaheen, and Timothy J. Coutts, Chris Weeks, Igor Levitsky, Jorma Peltola, and Paul Glatkowski, "Organic solar cells with carbon nanotubes replacing $In_2O_3$: Sn as the transparent electrode" Jun. 5, 2006, Applied Physics Letters 88, 233503.

"Allotropy," (Wikipedia, http://en.wikipedia.org/wiki/Allotropy, visited Jul. 9, 2014).

"Allotropes," I.U.P.A.C. Compendium of Chemical Terminology, 2nd ed. (the "Gold Book"). Compiled by A. D. McNaught and A. Wilkinson. Blackwell Scientific Publications, Oxford (1997). XML corrected version: http://goldbook.iupac.org (2006) created by M. Nic, J. Jirat, B. Kosata; updates compiled by A. Jenkins. ISBN 0-9678550-9-8. doi:10.13 visited Aug. 17, 2015.

"Allotropy," Wikipedia, https://en.wikipedia.org/wiki/Allotropy, visited Aug. 11, 2015.

Crowley, T.A., et al. "Synthesis of Metal and Metal Oxide Nanowire and Nanotube Arrays within a Mesoporous Silica Template," Chem. Mater., 2003, 15, 3518-3522.

Dickey, M.D., et al., "Fabrication of Arrays of Metal and Metal Oxide Nanotubes by Shadow Evaporation," ACS Nano, 2008, 2(4), 800-808 (Abstract only).

Gong, D., et al., "Titanium oxide nanotube arrays prepared by anodic oxidation," J. Mater. Res., 2001, 16(12), 3331-3334.

Satishkumar, B.C., et al. Synthesis of metal oxide nanorods using carbon nanotubes as templates,: J. Mater. Chem., 2000, 10, 2115-2119.

Sun, Y., et al. "Metal Nanostructures with Hollow Interiors," Adv. Mater., 2003, 17, 641-646.

Sun, Y., et al. "Synthesis and Optical Properties of Nanorattles and Multiple-Walled Nanoshells / Nanotubes Made of Metal Alloys," J. Am. Chem. Soc. 2004, 126, 9399-9406.

Wang, Z., et al., "Metal Oxide Hollow Nanostructures for Lithium-ion Batteries," Adv. Mater., 2012, 24, 1903-1911.

* cited by examiner

FIG. 3

ELECTRODE CONTAINING A POLYMER AND AN ADDITIVE

CROSS REFERENCE TO RELATED APPLICATIONS

Pursuant to 35 U.S.C. §119(e), this application claims priority to U.S. Provisional Application Ser. No. 60/909,539, filed Apr. 2, 2007, and U.S. Provisional Application Ser. No. 60/921,407, filed Apr. 2, 2007, the contents of which are hereby incorporated by reference.

TECHNICAL FIELD

The disclosure relates to articles having a novel electrode, as well as related systems, methods, modules, and components.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because although the semiconductive material can have a lower electrical conductivity than electrically conductive materials, the semiconductive material can transmit more light than many electrically conductive materials.

SUMMARY

This disclosure relates to articles having a novel electrode, as well as related systems, methods, modules, and components.

In one aspect, the disclosure features an article that includes two electrodes and a photoactive layer therebetween. An electrode includes a material and a grid atop of the material. The material includes a polymer and an additive. The article is configured as a semiconductive device (e.g., a photovoltaic cell).

In another aspect, the disclosure features an article that includes two electrodes and a photoactive layer therebetween. An electrode includes a polymer and an additive in the polymer. The additive has an average length to width aspect ratio of at least 5, a conductivity of at least 100 Siemens per centimeter, and/or a sheet resistance of at most 100 Ω/square. The photoactive layer includes an electron donor material and an electron acceptor material. The article is configured as a semiconductive device (e.g., a photovoltaic cell).

In still another aspect, the disclosure features an article that includes two electrodes and a photoactive layer therebetween. An electrode includes a polymer and an additive in the polymer. The additive includes a material selected from metals, alloys, metal oxides, carbon allotropes, and combinations thereof. The photoactive layer includes an electron donor material and an electron acceptor material. The article is configured as a semiconductive device (e.g., a photovoltaic cell).

Embodiments can include one or more of the following features.

In some embodiments, the material has a sheet resistance of at least 0.1 Ω/square and/or at most 500 Ω/square.

In some embodiments, the first polymer includes a polymer selected from the group consisting of polythiophenes, polyfluorenes, polyphenylene vinylenes, polyanilines, polyacetylenes, polyvinylcarbazoles, polyphenylenes, polysilanes, polythienylenevinylenes, polyisothianaphthanenes, and copolymers thereof.

In some embodiments, the additive has an average length to width aspect ratio of at least 5 (e.g., at least 50 or at least 100).

In some embodiments, the additive is in the shape selected from the group consisting of tubes, rods and needles.

In some embodiments, the additive has a conductivity of at least $10^2$ (e.g., at least $10^4$ or at least $10^6$) Siemens per centimeter (S/cm).

In some embodiments, the additive includes a material selected from the group consisting of metals, alloys, metal oxides, carbon allotropes, and combinations thereof.

In some embodiments, the additive includes a coating having a conductivity of at least 100 Siemens per centimeter.

In some embodiments, the material has a light transmittance of at least 75% (e.g., at least 85% or at least 95%) during use of the article.

In some embodiments, the material includes at least 50 weight percent (e.g., at least 70 weight percent or at least 85 weight percent) of the first polymer and/or at most 50 weight percent (e.g., at most 30 weight percent or at most 15 weight percent) of the additive.

In some embodiments, the material further includes a dopant for the first polymer. The dopant can include poly (styrene-sulfonate)s, polystyrene sulfonic acids, or sulfonated tetrafluoroethylenes.

In some embodiments, the article further includes a hole blocking layer between the first electrode and the photoactive layer. The hole blocking layer can include a material selected from the group consisting of LiF, metal oxides, amines, and combinations thereof. In certain embodiments, the first electrode, when measured in combination with the hole blocking layer, has a surface resistance of at most about 50 Ω/square.

In some embodiments, the electron donor material includes a polymer, such as a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly (dithienothiophene oxide)s, polytetrahydroisoindoles, and copolymers thereof. For example, the electron donor material can include poly(3-hexylthiophene) or poly(cyclopentadithiophene-co-benzothiadiazole).

In some embodiments, the electron acceptor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. For example, the electron acceptor material can include a substituted fullerene, such as [6,6]-phenyl C61-butyric acid methyl ester (C61-PCBM) and [6,6]-phenyl C71-butyric acid methyl ester (C71-PCBM).

In some embodiments, the article further includes a substrate, the first and second electrodes being supported by the substrate. In certain embodiments, the article can further include an additional substrate, the first and second electrodes being between the substrates.

In some embodiments, the grid includes a metal or an alloy.

In some embodiments, the material includes one layer that includes the first polymer and the additive in the first polymer. In certain embodiments, the material includes first and second layers, in which the first layer includes the first polymer, the second layer includes the additive, and the second layer is between the first layer and the grid. In such embodiments, the article can further include a third layer between the second layer and the grid, the third layer comprising a second polymer (e.g., an acrylic polymer).

Embodiments can include one or more of the following advantages.

Without wishing to be bound theory, it is believed that an additive with a high length to width aspect ratio can readily form a thin film (e.g., having a thickness of less than 1 μm) that includes a random network of the additive with interstitial open areas. When the additive is highly electrically conductive, such a thin film can have both high electrical conductivity and high transparency, two desirable properties for an electrode of a photovoltaic cell. Further, without wishing to be bound by theory, it is believed that such a film (i.e., a film containing a network of electrically conductive additive) can facilitate collection electrons in the open space between grids atop of the film, thereby improving the electrical conductivity of an electrode.

Without wishing to be bound by theory, it is believed that combining an additive with an electrically conductive homogenous polymer in an electrode (e.g., by disposing the additive in such a polymer) would provide enhanced conductivity in the interstitial open areas so that charge carriers (e.g., electrons or holes) generated in these areas can also be transported to the additive, thereby improving the electrical conductivity of the electrode.

Without wishing to be bound by theory, it is believed that combining an electrically conductive grid with a composite layer in an electrode could prolong the transport distance of charge carriers and improve the electrical conductivity of the electrode.

Other features and advantages of the embodiments will be apparent from the description, drawings and claims.

DESCRIPTION OF DRAWINGS

Like reference symbols in the various drawings indicate like elements.

DETAILED DESCRIPTION

Figure 1:
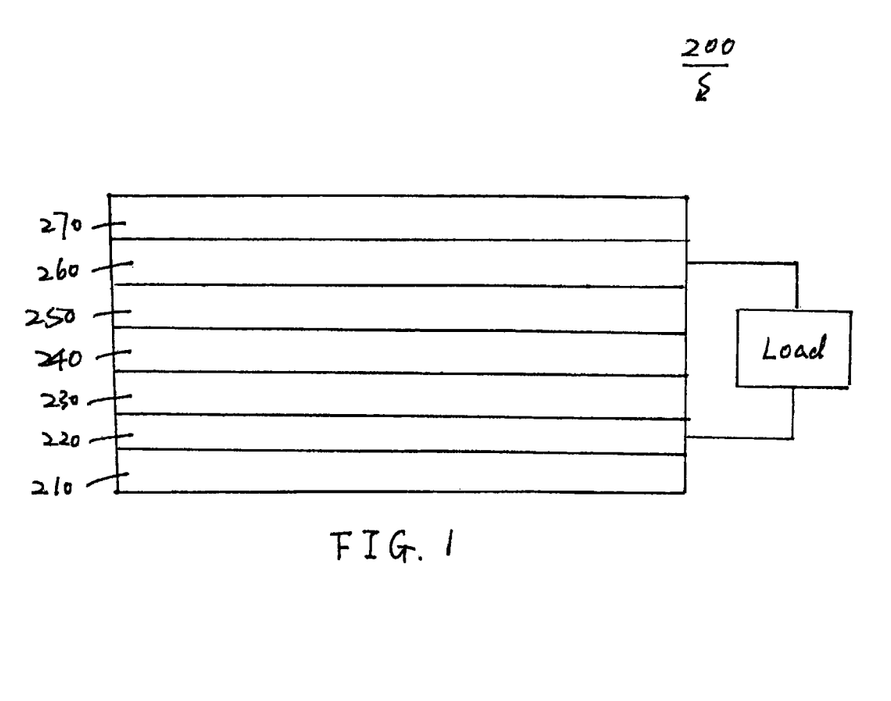
FIG. 1 is a cross-sectional view of an embodiment of a photovoltaic cell.

FIG. 1 shows a cross-sectional view of a photovoltaic cell 200 that includes a substrate 210, an electrode 220, an optional hole blocking layer 230, a photoactive layer 240 (containing an electron acceptor material and an electron donor material), an optional hole carrier layer 250, an electrode 260, and a substrate 270.

In general, during use, light impinges on the surface of substrate 270, and passes through substrate 270, electrode 260, and hole carrier layer 250. The light then interacts with photoactive layer 240, causing electrons to be transferred from the electron donor material in layer 240 to the electron acceptor material in layer 240. The electron acceptor material then transmits the electrons through hole blocking layer 230 to electrode 220, and the electron donor material transfers holes through hole carrier layer 250 to electrode 260. Electrodes 220 and 260 are in electrical connection via an external load so that electrons pass from electrode 220, through the load, and to electrode 260.

Figure 2A:
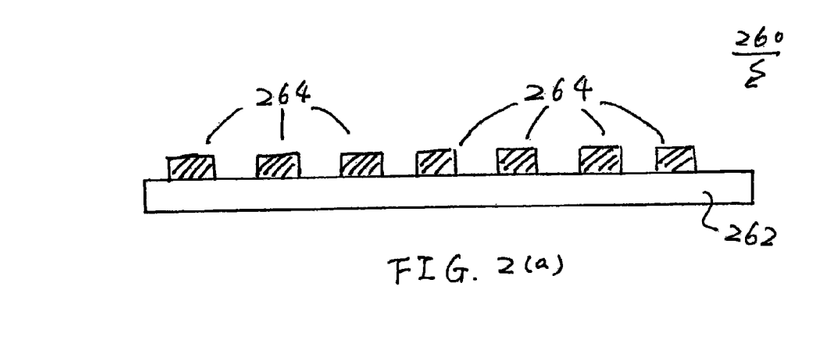
FIG. 2(a) is a cross-sectional view of an embodiment of an electrode of the photovoltaic cell in FIG. 1.

FIG. 2(a) shows a cross-sectional view of an embodiment of electrode 260 that includes a composite layer 262 and an optional grid 264. Composite layer 262 generally includes an additive and a polymer.

In general, the additive includes an electrically conductive material. Examples of electrically conductive materials include electrically conductive metals, electrically conductive alloys, electrically conductive metal oxides, and carbon allotropes. Exemplary electrically conductive metals include iron, gold, silver, copper, aluminum, nickel, palladium, platinum and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum, and alloys of titanium. Examples of carbon allotropes include carbon nanorods and carbon nanotubes (e.g., single wall carbon nanotubes, double wall carbon nanotubes, and multi wall carbon nanotubes). Examples of electrically conductive metal oxides include indium tin oxides, fluorinated tin oxides, tin oxides, zinc oxides, and titanium oxides. The metal oxides can be either undoped or doped with a dopant. Examples of dopants for metal oxides include salts or acids of fluoride, chloride, bromide, and iodide. In some embodiments, combinations of electrically conductive materials are used.

The additive can have, for example, a conductivity of at least $10^2$ S/cm (e.g., at least $10^3$ S/cm, at least $10^4$ S/cm, at least $10^5$ S/cm, or at least $10^6$ S/cm) and/or at most $10^9$ S/cm (e.g., at most $10^8$ S/cm, at most $10^7$ S/cm, or at most $10^6$ S/cm). In some embodiments, the additive can have a sheet resistance of at most 100 Ω/square (e.g., at most 10 Ω/square, at most 1 Ω/square, or at most 0.1 Ω/square) and/or at least 0.01 Ω/square (e.g., at least 0.05 Ω/square, at least 0.1 Ω/square, or at least 1 Ω/square). In some embodiments, the additive includes an inner core that is relatively non-conductive and a coating that is relatively conductive (e.g., having a conductivity of at least $10^2$ Siemens per centimeter).

In some embodiments, the additive has an average length to width aspect ratio of at least 5 (e.g., at least 50, at least 100, at least 1,000, or at least 5,000) and/or at most 10,000 (e.g., at most 5,000, at most 1,000, or at most 500). Exemplary shapes for the additive in layer 262 include tubes, rods and needles. Without wishing to be bound theory, it is believed that an additive with a high length to width aspect ratio can readily form a thin film (e.g., having a thickness of less than 1 μm) that includes a random network of the additive with interstitial open areas. When the additive is highly electrically conductive, such a thin film can have both high electrical conductivity and high transparency, two desirable properties for an electrode of a photovoltaic cell. Further, without wishing to be bound by theory, it is believed that such a film (i.e., a film containing a network of electrically conductive additive) can facilitate collection electrons in the open space between grids 264, thereby improving the electrical conductivity of electrode 260.

In some embodiments, the additive can have a length to width aspect ratio less than 5. For example, the additive can be spherical or elliptical, e.g., in the form of nanoparticles. In such embodiments, a thin film containing a web of additive particles can be formed by applying a composition of a polymer (e.g., a polyethylene terephthalate) and the additive particles to a substrate when the composition contains a relatively large amount of the additive particles. The additive particles are generally electrically connected in the film thus formed and can still have enough space between them to allow sufficient light transmittance. Thus, such a thin film can still have sufficient electrical conductivity and transparency for use in photovoltaic cell 200.

Typically, the polymer in layer 262 is an electrically conductive polymer. In some embodiments, the polymer in composite 262 can have a conductivity of at least 10 S/cm (e.g., at least 100 S/cm or at least 1,000 S/cm). Exemplary polymers include polythiophenes (e.g., poly(3,4-ethelynedioxythiophene) (PEDOT)), polyfluorenes, polyphenylene vinylenes, polyanilines, polyacetylenes, polyvinylcarbazoles, polyphenylenes, polysilanes, polythienylenevinylenes, polyisothianaphthanenes, and copolymers thereof. In some embodiments, the polymer is formed from thieno[3,4-b] thiophene monomer units. Examples of commercially available polymers that can be used in layer 262 include the Air Products® HIL family of thiophene polymers. In some embodiments, composite layer 262 can also include a dopant for the polymer. For example, the dopant can include poly (styrene-sulfonate)s, polystyrene sulfonic acids, or sulfonated tetrafluoroethylenes. Without wishing to be bound by theory, it is believed that, in some embodiments, the polymer can serve as a hole carrier layer that facilitates transfer of holes from photoactive layer 240 to electrode 260. In such embodiments, hole carrier 250 can be removed from photovoltaic cell 200.

In general, the additive in composite layer 262 is in the form of a random network having interstitial open areas. As a result, the electrical conductivity of the additive is inhomogeneous across the composite layer 262 at a micro-scale level. Without wishing to be bound by theory, it is believed that combining additive with an electrically conductive homogenous polymer (e.g., by disposing additive particles in such a polymer) would provide enhanced conductivity in the interstitial open areas so that charge carriers (e.g., holes) generated in these areas can also be transported to the additive and then to grid 264, thereby improving the electrical conductivity of electrode 260.

Generally, composite layer 262 has a light transmittance of at least 75% (e.g., at least 80%, at least 85%, at least 90%, at least 95%, at least 96%, at least 97%, at least 98%, or at least 99%). As used herein, the term "light transmittance" refers to the transmittance, at the thickness used in a photovoltaic cell, of incident light at a wavelength or a range of wavelengths (e.g., from about 350 nm to about 1,000 nm) used during operation of the photovoltaic cell.

Typically, composite layer 262 has a sheet resistance of at least 0.1 Ω/square (e.g., at least 1 Ω/square, or at least 10 Ω/square) and/or at most 500 Ω/square (e.g., at most 200 Ω/square, at most 100 Ω/square, at most 100 Ω/square, or at most 20 Ω/square). In some embodiments, layer 262 includes at least 50 weight percent (e.g., at least 60 weight percent, at least 75 weight percent, at least 80 weight percent, or at least 85 weight percent) of the polymer. In certain embodiments, layer 262 includes at most 50 weight percent (e.g., at most 30 weight percent, at most 15 weight percent, at most 10 weight percent or at most 5 weight percent) of the additive.

In general, composite layer 262 is sufficiently thin to be substantially transparent and sufficiently thick to be electrically conductive. In some embodiments, layer 262 has a thickness of at least about 10 nm (e.g., at least about 100 nm or at least 1 micron) and/or at most 5 microns (e.g., at most about 500 nm or at most about 250 nm).

Composite layer 262 can be prepared by a liquid-based coating process. The term "liquid-based coating process" mentioned herein refers to a process that uses a liquid-based coating composition. Examples of the liquid-based coating composition can be a solution, a dispersion, or a suspension. The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Examples of liquid-based coating processes have been described in, for example, commonly-owned co-pending U.S. Application Publication No. 2008-0006324, the contents of which are hereby incorporated by reference.

In some embodiments, composite layer 262 can be prepared by (1) mixing an additive (e.g., silver nanorods) and a polymer (e.g., a thiophene) in an organic solvent to form a dispersion, (2) coating the dispersion onto a substrate, and (3) drying the coated dispersion.

Grid 264 is generally formed of an electrically conductive material. Examples of electrically conductive materials that can be used in grid 264 include those noted above. In some embodiments, grid 264 is in the form of a mesh (e.g., when the space between the grids is relatively small). Examples of grid electrodes (e.g., mesh electrodes) are described in commonly owned co-pending U.S. Patent Application Publication Nos. 2004-0187911 and 2006-0090791, the contents of which are hereby incorporated by reference. Without wishing to be bound by theory, it is believed that given the relative small thickness and length of the additive, charge carriers may not be transported very far within the composite layer 263 and that combining grid 264 with composite layer 262 could prolong the transport distance of charge carriers and improve the electrical conductivity of electrode 260.

In general, grid 264 is in electrical contact with the electrically conductive additive. In some embodiments, grid 264 is at least partially embedded in composite layer 262. In some embodiments, grid 264 is fully embedded in composite layer 262.

When electrode 260 includes grid 264 atop composite layer 262, electrode 260 can have a light transmittance of at least 75% (e.g., at least 80%, at least 85%, at least 90%, at least 95%, at least 96%, at least 97%, at least 98%, or at least 99%) and a sheet resistance of at most 100 Ω/square (e.g., at most 50 Ω/square, at most 10 Ω/square, or at most 1 Ω/square).

In some embodiments, grid 264 can be formed by printing a printable material onto composite layer 262. In such embodiment, the printable material can include an electrically conductive material and a binder polymer. Examples of the binder polymer include amine/epoxy resins, phenoxy resins, and acrylic resins.

Figure 2B:
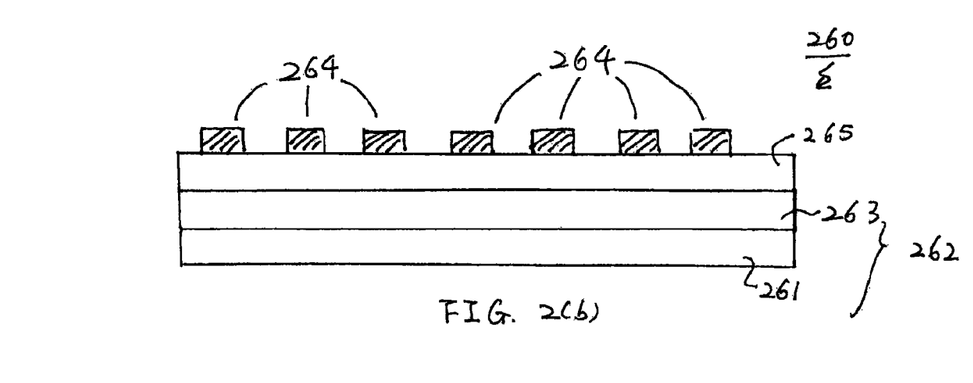
FIG. 2(b) is a cross-sectional view of another embodiment of an electrode of the photovoltaic cell in FIG. 1.

FIG. 2(b) shows a cross-sectional view of another embodiment of electrode 260 that includes a composite layer 262, an optional layer 265, and an optional grid 264. Composite layer 262 includes two layers, i.e., layers 261 and 263. Layer 261 includes a polymer such as one of the electrically conductive polymers described above and layer 263 includes an additive such as one of the additives described above. Without wishing to be bound by theory, it is believed that a photovoltaic cell including an electrically conductive polymer and an additive in two layers possesses a prolonged lifetime relative to a photovoltaic cell including an electrically conductive polymer and an additive in one layer. Further, without wishing to be bound by theory, it is believed that disposing a layer of an electrically conductive polymer between an additive layer and a photoactive layer could minimize recombination of electrons and holes in the additive, which would lower the efficiency of a photovoltaic cell.

In some embodiments, layer 263 is disposed between layer 261 and grid 264. In such embodiments, electrode 260 can further include layer 265 between layer 263 and grid 264. Layer 265 can include a polymer, such as acrylic resins, amine/epoxy resins, epoxy resins, and UV curable resins.

In general, layer 265 has a thickness small enough so that the electrically conductive additive in layer 263 is still in contact with grid 264 but large enough so that it can fix the additive to layer 261. In some embodiments, layer 265 has a thickness of at least about 10 nm (e.g., at least about 50 nm or at least 250 nm) and/or at most 2 microns (e.g., at most about 250 nm or at most about 100 nm).

In some embodiments, composite layer 262 shown in FIG. 2(b) can be prepared by (1) forming layer 261 by coating a solution containing a polymer (e.g., a thiophene) onto a substrate, and (2) forming layer 263 by coating a dispersion containing an additive (e.g., silver nanorods) onto layer 261. In some embodiments, layer 265 can be formed by applying a solution containing another polymer (e.g., an acrylic) onto layer 263.

Substrate 270 is generally formed of a transparent material. As used herein, a transparent material refers to a material that, at the thickness used in a photovoltaic cell, transmits at least about 70% (e.g., at least about 75%, at least about 80%, at least about 85%, or at least about 90%) of incident light at a wavelength or a range of wavelengths (e.g., from about 350 nm to about 1,000 nm) used during operation. Exemplary materials from which substrate 270 can be formed include polyethylene terephthalates, polyimides, polyethylene naphthalates, polymeric hydrocarbons, cellulosic polymers, polycarbonates, polyamides, polyethers and polyether ketones. In certain embodiments, the polymer can be a fluorinated polymer. In some embodiments, combinations of polymeric materials are used. In certain embodiments, different regions of substrate 270 can be formed of different materials.

In general, substrate 270 can be flexible, semi-rigid or rigid (e.g., glass). In some embodiments, substrate 270 has a flexural modulus of less than about 5,000 megaPascals. In certain embodiments, different regions of substrate 270 can be flexible, semi-rigid or inflexible (e.g., one or more regions flexible and one or more different regions semi-rigid, one or more regions flexible and one or more different regions inflexible).

Typically, substrate 270 is at least about one micron (e.g., at least about five microns, at least about 10 microns) thick and/or at most about 1,000 microns (e.g., at most about 500 microns thick, at most about 300 microns thick, at most about 200 microns thick, at most about 100 microns thick, at most about 50 microns) thick.

Generally, substrate 270 can be colored or non-colored. In some embodiments, one or more portions of substrate 270 is/are colored while one or more different portions of substrate 270 is/are non-colored.

Substrate 270 can have one planar surface (e.g., the surface on which light impinges), two planar surfaces (e.g., the surface on which light impinges and the opposite surface), or no planar surfaces. A non-planar surface of substrate 270 can, for example, be curved or stepped. In some embodiments, a non-planar surface of substrate 270 is patterned (e.g., having patterned steps to form a Fresnel lens, a lenticular lens or a lenticular prism).

Optionally, photovoltaic cell 200 can include a hole carrier layer 250 to facilitate charge transfer and charge transport in addition to the polymer in composite layer 262 (which could also function as a hole carrier layer). Hole carrier layer 250 is generally formed of a material that, at the thickness used in photovoltaic cell 200, transports holes to electrode 260 and substantially blocks the transport of electrons to electrode 260. Examples of materials from which layer 250 can be formed include semiconductive polymers, such as polythiophenes (e.g., PEDOT doped with a poly(styrene-sulfonate)), polyanilines, polyvinylcarbazoles, polyphenylenes, polyphenylvinylenes, polysilanes, polythienylenevinylenes, polyisothianaphthanenes, and copolymers thereof. In some embodiments, hole carrier layer 250 can include a dopant used in combination with a semiconductive polymer. Examples of dopants include poly(styrene-sulfonate)s (PSSs), polymeric sulfonic acids, or fluorinated polymers (e.g., fluorinated ion exchange polymers). In some embodiments, the materials that can be used to form hole carrier layer 250 include metal oxides, such as titanium oxides, zinc oxides, tungsten oxides, molybdenum oxides, copper oxides, strontium copper oxides, or strontium titanium oxides. The metal oxides can be either undoped or doped with a dopant. Examples of dopants for metal oxides includes salts or acids of fluoride, chloride, bromide, and iodide. In some embodiments, the materials that can be used to form hole carrier layer 250 include carbon allotropes (e.g., carbon nanotubes). The carbon allotropes can be embedded in a polymer binder. In some embodiments, hole carrier layer 250 can include combinations of hole carrier materials described above. In some embodiments, the hole carrier materials can be in the form of nanoparticles. The nanoparticles can have any suitable shape, such as a spherical, cylindrical, or rod-like shape.

In general, the thickness of hole carrier layer 250 (i.e., the distance between the surface of hole carrier layer 250 in contact with photoactive layer 240 and the surface of electrode 260 in contact with hole carrier layer 250) can be varied as desired. Typically, the thickness of hole carrier layer 250 is at least 0.01 micron (e.g., at least about 0.05 micron, at least about 0.1 micron, at least about 0.2 micron, at least about 0.3 micron, or at least about 0.5 micron) and/or at most about five microns (e.g., at most about three microns, at most about two microns, or at most about one micron). In some embodiments, the thickness of hole carrier layer 250 is from about 0.01 micron to about 0.5 micron.

Photoactive layer 240 generally contains an electron acceptor material (e.g., an organic electron acceptor material) and an electron donor material (e.g., an organic electron donor material).

Examples of electron acceptor materials include fullerenes, inorganic nanoparticles, oxadiazoles, discotic liquid crystals, carbon nanorods, inorganic nanorods, polymers containing moieties capable of accepting electrons or forming stable anions (e.g., polymers containing CN groups, polymers containing $CF_3$ groups), or combinations thereof. In some embodiments, the electron acceptor material is a substituted fullerene (e.g., C61-PCBM or C71-PCBM). In some embodiments, a combination of electron acceptor materials can be used in photoactive layer 240.

Examples of electron donor materials include conjugated polymers, such as polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof. In some embodiments, the electron donor material can be polythiophenes (e.g., poly(3-hexylthiophene)), polycyclopentadithiophenes, and copolymers thereof. In certain embodiments, a combination of electron donor materials can be used in photoactive layer 240.

In some embodiments, the electron donor materials or the electron acceptor materials can include a polymer having a first comonomer repeat unit and a second comonomer repeat unit different from the first comonomer repeat unit. The first comonomer repeat unit can include a cyclopentadithiophene moiety, a silacyclopentadithiophene moiety, a cyclopentadithiazole moiety, a thiazolothiazole moiety, a thiazole moiety, a benzothiadiazole moiety, a thiophene oxide moiety, a cyclopentadithiophene oxide moiety, a polythiadiazoloquinoxaline moiety, a benzoisothiazole moiety, a benzothiazole moiety, a thienothiophene moiety, a thienothiophene oxide moiety, a dithienothiophene moiety, a dithienothiophene oxide moiety, or a tetrahydroisoindoles moiety.

In some embodiments, the first comonomer repeat unit includes a cyclopentadithiophene moiety. In some embodiments, the cyclopentadithiophene moiety is substituted with at least one substituent selected from the group consisting of $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, and SO$_2$R; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, the cyclopentadithiophene moiety can be substituted with hexyl, 2-ethylhexyl, or 3,7-dimethyloctyl. In certain embodiments, the cyclopentadithiophene moiety is substituted at 4-position. In some embodiments, the first comonomer repeat unit can include a cyclopentadithiophene moiety of formula (1):

(1)

In formula (1), each of H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or SO$_2$R; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$, independently, can be hexyl, 2-ethylhexyl, or 3,7-dimethyloctyl.

An alkyl can be saturated or unsaturated and branch or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —CH$_3$, —CH$_2$—, —CH$_2$=CH$_2$—, —CH$_2$—CH=CH$_2$, and branched —C$_3$H$_7$. An alkoxy can be branch or straight chained and saturated or unsaturated. An $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —OCH$_3$ and —OCH=CH—CH$_3$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moieties include cyclohexyl and cyclohexen-3-yl. A heterocycloalkyl can also be either saturated or unsaturated. A $C_3$-$C_{20}$ heterocycloalkyl contains at least one ring heteroatom (e.g., O, N, and S) and 3 to 20 carbon atoms (e.g., three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, anthryl, and phenanthryl. A heteroaryl can contain one or more aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl include all of the above-recited substituents except $C_1$-$C_{20}$ alkyl. Cycloalkyl, heterocycloalkyl, aryl, and heteroaryl also include fused groups.

The second comonomer repeat unit can include a benzothiadiazole moiety, a thiadiazoloquinoxaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety. In some embodiments, the second comonomer repeat unit is a 3,4-benzo-1,2,5-thiadiazole moiety.

In some embodiments, the second comonomer repeat unit can include a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

-continued

(17)

(18)

(19)

(20)

(21)

(22)

(23)

(24)

(25)

-continued

(26)

(27)

(28)

(29)

(30)

(31)

(32)

(33)

(34)

In the above formulas, each of X and Y, independently, is $CH_2$, O, or S; each of $R_5$ and $R_6$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. In some embodiments, the second comonomer repeat unit includes a benzothiadiazole moiety of formula (2), in which each of $R_5$ and $R_6$ is H.

The second comonomer repeat unit can include at least three thiophene moieties. In some embodiments, at least one of the thiophene moieties is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl. In certain embodiments, the second comonomer repeat unit includes five thiophene moieties.

The polymer can further include a third comonomer repeat unit that contains a thiophene moiety or a fluorene moiety. In some embodiments, the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

In some embodiments, the polymer can be formed by any combination of the first, second, and third comonomer repeat units. In certain embodiments, the polymer can be a homopolymer containing any of the first, second, and third comonomer repeat units.

In some embodiments, the polymer can be in which n can be an integer greater than 1.

The monomers for preparing the polymers mentioned herein may contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

The polymers in photoactive layer 240 described above can be prepared by methods known in the art, such as those described in commonly owned co-pending U.S. Application Publication No 2007-0131270, the contents of which are hereby incorporated by reference. For example, a copolymer can be prepared by a cross-coupling reaction between one or more comonomers containing two alkylstannyl groups and one or more comonomers containing two halo groups in the presence of a transition metal catalyst. As another example, a copolymer can be prepared by a cross-coupling reaction between one or more comonomers containing two borate groups and one or more comonomers containing two halo groups in the presence of a transition metal catalyst. The comonomers can be prepared by the methods known in the art, such as those described in U.S. Application Publication No. 2007-0020526, Coppo et al., *Macromolecules* 2003, 36, 2705-2711 and Kurt et al., *J. Heterocycl. Chem.* 1970, 6, 629, the contents of which are hereby incorporated by reference.

Without wishing to be bound by theory, it is believed that an advantage of the polymers in photoactive layer 240 described above is that their absorption wavelengths shift toward the red and near IR regions (e.g., 650-800 nm) of the electromagnetic spectrum, which is not accessible by most other conventional polymers. When such a polymer is incorporated into a photovoltaic cell together with a conventional polymer, it enables the cell to absorb the light in this region of the spectrum, thereby increasing the current and efficiency of the cell.

Generally, photoactive layer 240 is sufficiently thick to be relatively efficient at absorbing photons impinging thereon to form corresponding electrons and holes, and sufficiently thin to be relatively efficient at transporting the holes and electrons. In certain embodiments, photoactive layer 240 is at least 0.05 micron (e.g., at least about 0.1 micron, at least about 0.2 micron, or at least about 0.3 micron) thick and/or at most about one micron (e.g., at most about 0.5 micron or at most about 0.4 micron) thick. In some embodiments, photoactive layer 240 is from about 0.1 micron to about 0.2 micron thick.

Optionally, photovoltaic cell 200 can include a hole blocking layer 230 between photoactive layer 240 and electrode 220. Hole blocking layer 230 is generally formed of a material that, at the thickness used in photovoltaic cell 200, transports electrons to electrode 220 and substantially blocks the transport of holes to electrode 260. Examples of materials from which layer 230 can be formed include LiF, amines (e.g., primary, secondary, tertiary amines, or aminosiloxanes), and metal oxides (e.g., zinc oxide or titanium oxide). Examples of amines suitable for use in a hole blocking layer have been described, for example, in co-pending U.S. Provisional Application No. 60/926,459, the entire contents of which are hereby incorporated by reference. Without wishing to be bound by theory, it is believed that when photovoltaic cell 200 includes a hole blocking layer made of amines, the hole blocking layer can facilitate the formation of ohmic contact between photoactive layer 240 and electrode 220, thereby reducing damage to photovoltaic cell 200 resulted from UV exposure.

Typically, hole blocking layer 230 is at least 0.005 micron (e.g., at least about 0.03 micron, at least about 0.04 micron, or at least about 0.05 micron) thick and/or at most about 0.05 micron (e.g., at most about 0.04 micron, at most about 0.03 micron, at most about 0.02 micron, or at most about 0.01 micron) thick.

Electrode 220 is generally formed of an electrically conductive material, such as one or more of the electrically conductive materials described above. In some embodiments, electrode 220 is in the form of a single layer (e.g., containing one or more of the above-noted electrically conductive materials). In certain embodiments, electrode 220 is formed of multiple layers (e.g., containing one or more of the above-noted electrically conductive materials).

In some embodiments, electrode 220 can be substantially transparent. In some embodiments, electrode 220 can be formed of a transparent electrode, such as an ITO electrode or a grid electrode (e.g., a mesh electrode). In some embodiments, electrode 220 can be formed of the same materials or have the same characteristics as electrode 260.

Substrate 210 can be identical to or different from substrate 270. In some embodiments, substrate 210 can be formed of one or more suitable polymers, such as those used to form substrate 270 described above.

Figure 3:
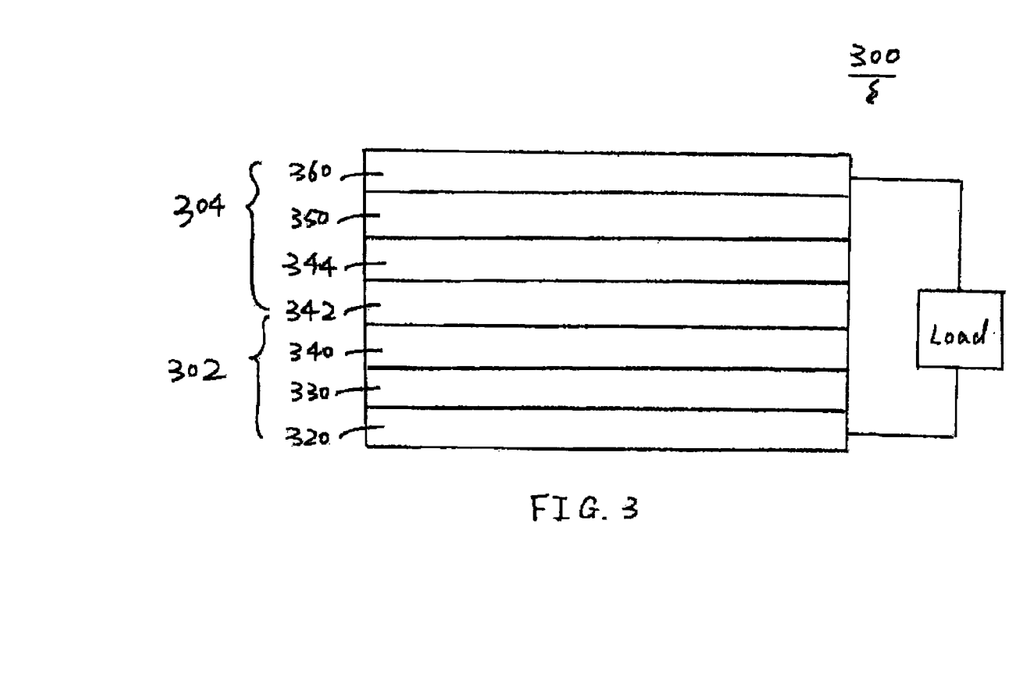
FIG. 3 is a cross-sectional view of an embodiment of a tandem photovoltaic cell.

FIG. 3 shows a tandem photovoltaic cell 300 having two semi-cells 302 and 304. Semi-cell 302 includes an electrode 320, a hole carrier layer 330, a first photoactive layer 340, and a recombination layer 342. Semi-cell 304 includes recombination layer 342, a second photoactive layer 344, a hole blocking layer 350, and an electrode 360. An external load is connected to photovoltaic cell 300 via electrodes 320 and 360. In some embodiments, electrode 320 can be formed of the same materials or have the same characteristics as electrode 260 shown in FIG. 2(a) or 2(b).

Depending on the production process and the desired device architecture, the current flow in a semi-cell can be reversed by changing the electron/hole conductivity of a certain layer (e.g., changing hole blocking layer 350 to a hole carrier layer). By doing so, a tandem cell can be designed such that the semi-cells in the tandem cells can be electrically interconnected either in series or in parallel.

A recombination layer refers to a layer in a tandem cell where the electrons generated from a first semi-cell recombine with the holes generated from a second semi-cell. Recombination layer 342 typically includes a p-type semiconductor material and an n-type semiconductor material. In general, n-type semiconductor materials selectively transport electrons and p-type semiconductor materials selectively transport holes. As a result, electrons generated from the first semi-cell recombine with holes generated from the second semi-cell at the interface of the n-type and p-type semiconductor materials.

In some embodiments, the p-type semiconductor material includes a polymer and/or a metal oxide. Examples p-type semiconductor polymers include polythiophenes (e.g., poly (3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The metal oxide can be an intrinsic p-type semiconductor (e.g., copper oxides, strontium copper oxides, or strontium titanium oxides) or a metal oxide that forms a p-type semiconductor after doping with a dopant (e.g., p-doped zinc oxides or p-doped titanium oxides). Examples of dopants includes salts or acids of fluoride, chloride, bromide, and iodide. In some embodiments, the metal oxide can be used in the form of nanoparticles.

In some embodiments, the n-type semiconductor material (either an intrinsic or doped n-type semiconductor material) includes a metal oxide, such as titanium oxides, zinc oxides, tungsten oxides, molybdenum oxides, and combinations thereof. The metal oxide can be used in the form of nanoparticles. In other embodiments, the n-type semiconductor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

In some embodiments, the p-type and n-type semiconductor materials are blended into one layer. In certain embodiments, recombination layer 342 includes two layers, one layer including the p-type semiconductor material and the other layer including the n-type semiconductor material. In such embodiments, recombination layer 342 can include a layer of mixed n-type and p-type semiconductor materials at the interface of the two layers.

In some embodiments, recombination layer 342 includes at least about 30 wt % (e.g., at least about 40 wt % or at least about 50 wt %) and/or at most about 70 wt % (e.g., at most about 60 wt % or at most about 50 wt %) of the p-type semiconductor material. In some embodiments, recombination layer 342 includes at least about 30 wt % (e.g., at least about 40 wt % or at least about 50 wt %) and/or at most about 70 wt % (e.g., at most about 60 wt % or at most about 50 wt %) of the n-type semiconductor material.

Recombination layer 342 generally has a sufficient thickness so that the layers underneath are protected from any solvent applied onto recombination layer 342. In some embodiments, recombination layer 342 can have a thickness at least about 10 nm (e.g., at least about 20 nm, at least about 50 nm, or at least about 100 nm) and/or at most about 500 nm (e.g., at most about 200 nm, at most about 150 nm, or at most about 100 nm).

In general, recombination layer 342 is substantially transparent. For example, at the thickness used in a tandem photovoltaic cell 300, recombination layer 342 can transmit at least about 70% (e.g., at least about 75%, at least about 80%, at least about 85%, or at least about 90%) of incident light at a wavelength or a range of wavelengths (e.g., from about 350 nm to about 1,000 nm) used during operation of the photovoltaic cell.

Recombination layer 342 generally has a sufficiently low surface resistance. In some embodiments, recombination layer 342 has a surface resistance of at most about $1 \times 10^6$ ohm/square (e.g., at most about $5 \times 10^5$ ohm/square, at most about $2 \times 10^5$ ohm/square, or at most about $1 \times 10^5$ ohm/square).

Without wishing to be bound by theory, it is believed that recombination layer 342 can be considered as a common electrode between two semi-cells (e.g., one including electrode 320, hole carrier layer 330, photoactive layer 340, and recombination layer 342, and the other include recombination layer 342, photoactive layer 344, hole blocking layer 350, and electrode 360) in photovoltaic cells 300. In some embodiments, recombination layer 342 can include an electrically conductive grid (e.g., mesh) material, such as those described above. An electrically conductive grid material can provide a selective contact of the same polarity (either p-type or n-type) to the semi-cells and provide a highly conductive but transparent layer to transport electrons to a load.

In some embodiments, recombination layer 342 can be prepared by applying a blend of an n-type semiconductor material and a p-type semiconductor material on photoactive layer. For example, an n-type semiconductor and a p-type semiconductor can be first dispersed and/or dissolved in a solvent together to form a dispersion or solution and then coated the dispersion or solution on a photoactive layer to form a recombination layer.

In some embodiments, a two-layer recombination layer can be prepared by applying a layer of an n-type semiconductor material and a layer of a p-type semiconductor material separately. For example, when titanium oxide nanoparticles are used as an n-type semiconductor material, a layer of titanium oxide nanoparticles can be formed by (1) dispersing a precursor (e.g., a titanium salt) in a solvent (e.g., an anhydrous alcohol) to form a dispersion, (2) coating the dispersion on a photoactive layer, (3) hydrolyzing the dispersion to form a titanium oxide layer, and (4) drying the titanium oxide layer. As another example, when a polymer (e.g., PEDOT) is used a p-type semiconductor, a polymer layer can be formed by first dissolving the polymer in a solvent (e.g., an anhydrous alcohol) to form a solution and then coating the solution on a photoactive layer.

Other examples of tandem photovoltaic cells have been described in, for example, commonly owned co-pending U.S. Application Publication No. 2007-0181179 and U.S. Application No. 2007-0246094, the entire contents of which are hereby incorporated by reference.

Other components in tandem cell 300 can be identical to those in photovoltaic cell 200 described above.

In some embodiments, the semi-cells in a tandem cell are electrically interconnected in series. When connected in series, in general, the layers can be in the order shown in FIG. 3. In certain embodiments, the semi-cells in a tandem cell are electrically interconnected in parallel. When interconnected in parallel, a tandem cell having two semi-cells can include the following layers: a first electrode, a first hole carrier layer, a first photoactive layer, a first hole blocking layer (which can serve as an electrode), a second hole blocking layer (which can serve as an electrode), a second photoactive layer, a second hole carrier layer, and a second electrode. In such embodiments, the first and second hole blocking layers can be either two separate layers or can be one single layer. In case the conductivity of the first and second hole blocking layer is not sufficient, an additional layer (e.g., an electrically conductive mesh layer) providing the required conductivity may be inserted.

In some embodiments, a tandem cell can include more than two semi-cells (e.g., three, four, five, six, seven, eight, nine, ten, or more semi-cells). In certain embodiments, some semi-cells can be electrically interconnected in series and some semi-cells can be electrically interconnected in parallel.

In general, the methods of preparing each layer in photovoltaic cells described in FIGS. 1-3 can vary as desired. In some embodiments, a layer can be prepared by a liquid-based coating process. In certain embodiments, a layer can be prepared via a gas phase-based coating process, such as chemical or physical vapor deposition processes.

In some embodiments, when a layer includes inorganic semiconductor nanoparticles, the liquid-based coating process can be carried out by (1) mixing the nanoparticles with a solvent (e.g., an aqueous solvent or an anhydrous alcohol) to form a dispersion, (2) coating the dispersion onto a substrate, and (3) drying the coated dispersion. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a substrate, (3) hydrolyzing the dispersion to form an inorganic semiconductor nanoparticles layer (e.g., a titanium oxide nanoparticles layer), and (4) drying the inorganic semiconductor material layer. In certain embodiments, the liquid-based coating process can be carried out by a sol-gel process (e.g., by form metal oxide nanoparticles as a sol-gel in the dispersion before coating the dispersion on the substrate).

In general, the liquid-based coating process used to prepare a layer containing an organic semiconductor material can be the same as or different from that used to prepare a layer containing an inorganic semiconductor material. In some embodiments, when a layer includes an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion.

In some embodiments, the photovoltaic cells described in FIGS. 1-3 can be prepared in a continuous manufacturing process, such as a roll-to-roll process, thereby significantly reducing the manufacturing cost. Examples of roll-to-roll processes have been described in, for example, commonly-owned co-pending U.S. Application Publication No. 2005-0263179, the contents of which are hereby incorporated by reference.

While certain embodiments have been disclosed, other embodiments are also possible.

In some embodiments, photovoltaic cell 200 includes a cathode as a bottom electrode and an anode as a top electrode. In some embodiments photovoltaic cell 200 can also include an anode as a bottom electrode and a cathode as a top electrode.

In some embodiments, photovoltaic cell 200 can include the layers shown in FIG. 1 in a reverse order. In other words, photovoltaic cell 200 can include these layers from the bottom to the top in the following sequence: a substrate 270, an electrode 260, an optional hole carrier layer 250, a photoactive layer 240, an optional hole blocking layer 230, an electrode 220, and a substrate 210.

Figure 4:
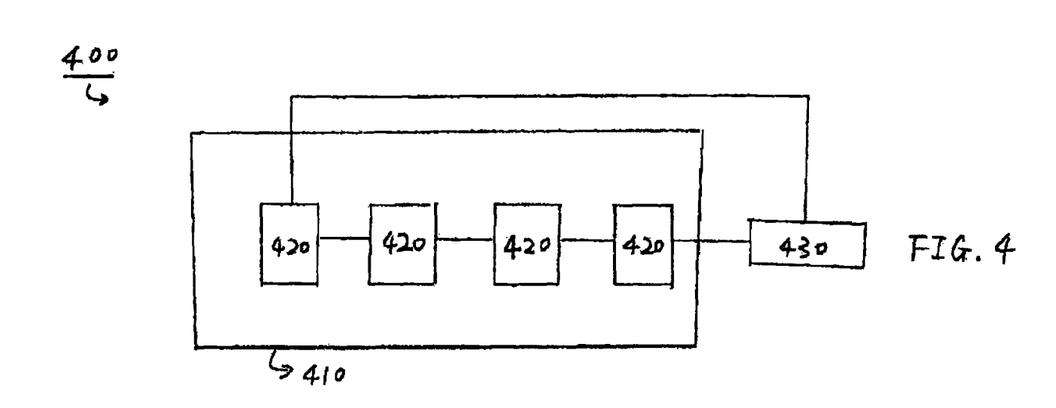
FIG. 4 is a schematic of a system containing multiple photovoltaic cells electrically connected in series.
Figure 5:
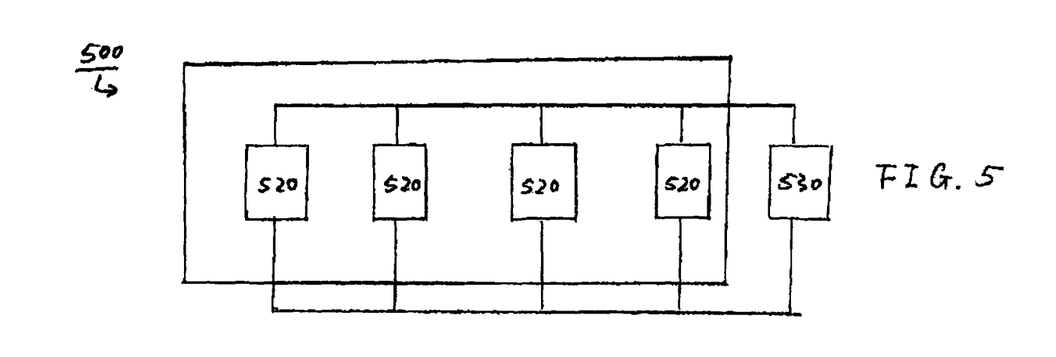
FIG. 5 is a schematic of a system containing multiple photovoltaic cells electrically connected in parallel.

In some embodiments, multiple photovoltaic cells can be electrically connected to form a photovoltaic system. As an example, FIG. 4 is a schematic of a photovoltaic system 400 having a module 410 containing photovoltaic cells 420. Cells 420 are electrically connected in series, and system 400 is electrically connected to a load 430. As another example, FIG. 5 is a schematic of a photovoltaic system 500 having a module 510 that contains photovoltaic cells 520. Cells 520 are electrically connected in parallel, and system 500 is electrically connected to a load 530. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

While organic photovoltaic cells have been described, other photovoltaic cells can also be integrated with one of the novel electrodes described herein. Examples of such photovoltaic cells include dye sensitized photovoltaic cells and inorganic photovoltaic cells with an photoactive material formed of amorphous silicon, cadmium selenide, cadmium telluride, copper indium selenide, and copper indium gallium selenide. In some embodiments, a hybrid photovoltaic cell can be integrated with one of the novel electrodes described herein.

While photovoltaic cells have been described above, in some embodiments, the novel electrodes described herein can be used in other devices and systems. For example, the polymers can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs (OLEDs) or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

EXAMPLE

A photovoltaic cell with an electrode containing silver nanorods was prepared as follows: An ITO coated glass substrate was cleaned by sonicating in acetone and isopropanol for 10 minutes, respectively. The substrate was then treated with UV/ozone for 10 minutes. A 0.5% solution of TYZOR TNBT (E.I. du Pont de Nemours and Company, Wilmington, Del.) in isopropanol was stirred at room temperature for 15 minutes and was blade coated onto the ITO at a speed of 40 mm/s at 40° C. to form a titanium oxide layer. The titanium oxide layer thus formed was allowed to dry on a hot plate. A semiconductor blend of P3HT and PCBM in a mixture of tetralene and xylene was blade coated onto the titanium oxide layer at a speed of 40 mm/s at 65° C. and was dried to form a photoactive layer. The article thus formed was spun at 500 rpm for 10 seconds. During this period, a layer of PEDOT:PSS (BAYTRON PHCV4 with 0.1 wt % of DYNOL 1604, 0.1 wt % of Zonyl FSN, 0.6 wt % SILQUEST A187, and 5 wt % glycerol; H.C. Starck, Newton, Mass.) was added to the photoactive layer and was spin-coated on top of the photoactive layer for 60 seconds at 2500 rpm to form a PEDOT layer. The article was then annealed in a glove box at 140° C. for 5 minutes. A layer of silver nanorods (Cambrios Technologies Corp., Mountain View, Calif.) was blade-coated onto the PEDOT layer at a speed of 10 mm/s at 65° C., followed by annealing in a glove box at 120° C. for 5 minutes. A photovoltaic cell was formed by evaporating a silver grid with a thickness of 500 nm, a length of 2 mm, and a grid opening of 2 mm onto the silver nanorods layer, followed by forming a silver contact pad with a thickness of 100 nm connecting the silver grid.

The performance of the photovoltaic cells prepared above was measured. The results showed that the photovoltaic cell functioned well, with an efficiency of about 1.6%, a $V_{oc}$ of about 0.6 V, a $J_{sc}$ of about 7.5 mA/cm$^2$, and a fill factor of about 45.

Other embodiments are in the claims.

What is claimed is:

1. An article, comprising:
   a first electrode;
   a second electrode comprising a material and a grid, wherein the grid is at least partially embedded in the material, the material comprising first, second, and third layers, in which
      the first layer comprises a first polymer,
      the second layer comprises an electrically conductive additive selected from the group consisting of metals, alloys, metal oxides, and combinations thereof, wherein the additive is in the shape selected from the group consisting of tubes, rods and needles, and wherein the additive has an average length to width aspect ratio of at least 5, the second layer is between the first layer and the grid,
      the third layer comprises a second polymer different from the first polymer, wherein the second polymer comprises an electrically insulating polymer, and the third layer is between the second layer and the grid, wherein the grid is in electrical contact with the electrically conductive additive and
   a photoactive layer between the first and second electrodes, wherein the material of the second electrode is between the grid of the second electrode and the photoactive layer, the photoactive layer comprising an electron donor material and an electron acceptor material,
   wherein the article is configured as a photovoltaic cell.

2. The article of claim 1, wherein the first polymer comprises a polymer selected from the group consisting of polythiophenes, polyfluorenes, polyphenylene vinylenes, polyanilines, polyacetylenes, polyvinylcarbazoles, polyphenylenes, polysilanes, polythienylenevinylenes, polyisothianaphthanenes, and copolymers thereof.

3. The article of claim 1, wherein the first polymer comprises a polythiophene.

4. The article of claim 1, wherein the electron donor material comprises a polymer.

5. The article of claim 4, wherein the electron donor material comprises a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof.

6. The article of claim 5, wherein the electron donor material comprises a polymer selected from the group consisting of polythiophenes, polycyclopentadithiophenes, and copolymers thereof.

7. The article of claim 1, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

8. The article of claim 1, further comprising a substrate, the first and second electrodes being supported by the substrate.

9. The article of claim 8, further comprising an additional substrate, the first and second electrodes being between the substrates.

10. The article of claim 1, wherein the grid comprises a metal or an alloy.

11. The article of claim 1, wherein the additive is at least partially embedded in the third layer.

12. The article of claim 1, wherein the electrically insulating polymer comprises an acrylic resin, an amine resin, an epoxy resin, or a UV curable resin.

* * * * *